United States Patent
Yen et al.

(10) Patent No.: US 10,651,817 B2
(45) Date of Patent: May 12, 2020

(54) BULK ACOUSTIC WAVE RESONATOR ON A STRESS ISOLATED PLATFORM

(71) Applicant: Texas Instruments Incorporated, Dallas, TX (US)

(72) Inventors: Ting-Ta Yen, San Jose, CA (US); Brian Goodlin, Plano, TX (US); Ricky Alan Jackson, Richardson, TX (US); Nicholas Stephen Dellas, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 27 days.

(21) Appl. No.: 15/857,906

(22) Filed: Dec. 29, 2017

(65) Prior Publication Data

US 2019/0207581 A1    Jul. 4, 2019

(51) Int. Cl.
| | |
|---|---|
| H03H 9/02 | (2006.01) |
| B81C 1/00 | (2006.01) |
| B81B 7/00 | (2006.01) |
| H03H 3/007 | (2006.01) |
| H03H 9/17 | (2006.01) |
| H03H 9/05 | (2006.01) |
| H03H 9/10 | (2006.01) |
| H03H 9/09 | (2006.01) |

(52) U.S. Cl.
CPC ....... *H03H 9/02433* (2013.01); *B81B 7/0016* (2013.01); *B81B 7/0048* (2013.01); *B81C 1/0015* (2013.01); *H03H 3/0073* (2013.01); *H03H 9/02133* (2013.01); *H03H 9/0547* (2013.01); *H03H 9/09* (2013.01); *H03H 9/1007* (2013.01); *H03H 9/174* (2013.01); *H03H 9/175* (2013.01); *B81B 2201/0271* (2013.01); *B81B 2203/0118* (2013.01); *B81B 2203/0315* (2013.01); *B81B 2207/012* (2013.01); *B81C 2203/0154* (2013.01); *B81C 2203/0785* (2013.01); *H03H 2009/0248* (2013.01)

(58) Field of Classification Search
CPC .......... H03H 9/02433; H03H 9/02133; H03H 3/0073; H03H 2009/0248; B81B 7/0016; B81B 2201/0271; B81B 2203/0315; B81B 2207/012; B81B 2203/0118; B81C 1/0015; B81C 2203/0785
USPC ....................................................... 257/416
See application file for complete search history.

(56) References Cited

U.S. PATENT DOCUMENTS

| | | | |
|---|---|---|---|
| 2006/0166393 A1* | 7/2006 | Ha ...................... | B81C 1/00047 438/53 |
| 2006/0290449 A1 | 12/2006 | Piazza | |
| | | (Continued) | |

OTHER PUBLICATIONS

Matthew, 'What is the Young's Modulus of Silicon?', Journal of Microelectromechanical Systems, vol. 19, No. 2, Apr. 2010 (Year: 2010).*

(Continued)

*Primary Examiner* — Mohammad M Hoque
(74) *Attorney, Agent, or Firm* — Dawn Jos; Charles A. Brill; Frank D. Cimino

(57) ABSTRACT

In described examples of a micromechanical system (MEMS), a rigid cantilevered platform is formed on a base substrate. The cantilevered platform is anchored to the base substrate by only a single anchor point. A MEMS resonator is formed on the cantilevered platform.

24 Claims, 8 Drawing Sheets

(56) References Cited

U.S. PATENT DOCUMENTS

| | | | | |
|---|---|---|---|---|
| 2008/0128901 | A1* | 6/2008 | Zurcher | B81C 1/00238 257/724 |
| 2014/0295365 | A1* | 10/2014 | Casset | F03G 7/06 432/1 |
| 2015/0021721 | A1* | 1/2015 | Romig | B81C 1/00269 257/416 |
| 2016/0043663 | A1* | 2/2016 | Katsumura | H02N 2/188 310/339 |
| 2017/0283249 | A1* | 10/2017 | Dogiamis | B81C 1/0015 |

OTHER PUBLICATIONS

"Acoustic Wave Resonators Having Fresnel Surfaces", U.S. Appl. No. 15/639,478, filed Jun. 30, 2017, pp. 1-14.

"Unreleased Plane Acoustic Wave Resonators", U.S. Appl. No. 15/671,996, filed Aug. 8, 2017, pp. 1-13.

Jaibir Sharma, Sanchitha Fernando, and Wee Ming Tan, "Integration of AlN with molybdenum electrodes and sacrificial amorphous silicon release using XeF2", Journal of Micromechanics and Microengineering, vol. 24, No. 3, Feb. 28, 2014, pp. 1-11.

"ASTM F2792-12a, Standard Terminology for Additive Manufacturing Technologies", ASTM International, West Conshohocken, PA, Mar. 1, 2012, pp. 1-3.

Arun Paidmarri et all, "A 0.68V 0.68mW 2.4GHz PLL for Ultra-low Power RF Systems", 2015 IEEE Radio Frequency Integrated Circuits Symposium (RFIC), May 17-19, 2015, Phoenix, AZ, pp. 1-4.

Andrew Nelson et all, "A 22uW, 2.0GHz FBAR Oscillator", 2011 IEEE Radio Frequency Integrated Circuits Symposium (RFIC), Jun. 5-7, 2011, Baltimore, MD, pp. 1-4.

Kourosh Khosraviani and Albert M Leung, "Stress anisotropy compensation of the sputter-deposited metal thini films by variable bias voltage", Journal of Micromechanics and Microengineering, vol. 23, No. 8, Jun. 21, 2013, pp. 1-7.

Gianluca Piazza, "Large-scale integration of nano-electromechanical resonators and switches", available at http://spie.org/newsroom/3018-large-scale-integration-of-nano-electromechanical-resonators-and-switches on Dec. 28, 2017, pp. 1-2.

Buddhadev Pradhan and Bhaskar Gupta, "C-Band Series connected CSRR Tunable BAnd Reject Filter Using MEMS bridges on silicon substrate", IEEE Journal of MIcroelectromechanical Systems, JMEMS-2017-0213, Sep. 8, 2017, pp. 1-8.

R. Colin Johnson, "Sand 9 MEMS Cracks Cellphone Market", EE Times, available at https://www.eetimes.com/document.asp?doc_id=1319381 on Dec. 28, 2017, pp. 1-4.

Yasin Kilinc, Ugar Unal, and B. Erdem Alaca, "Residual stressgradients in electroplated nickel thin films", Microelectronic Engineering, vol. 134, Feb. 20, 2015, pp. 60-67.

"Crystal oscillator", Wikipedia, available at http://en.wikipedia.org/wiki/Crystal_oscillator on Dec. 28, 2017, pp. 1-24.

Ed Nisley, "Opening a Quartz Crystal Can: Effects Thereof", available at https://softsolder.com/2010/05/15/opening-a-quartz-crystal-can-effects-thereof/ on Dec. 28, 2017, pp. 1-4.

* cited by examiner

BULK ACOUSTIC WAVE RESONATOR ON A STRESS ISOLATED PLATFORM

TECHNICAL FIELD

This relates to acoustic wave resonators fabricated on a stress isolated platform.

BACKGROUND

Micro-resonators fabricated with microelectromechanical system (MEMS) technologies are used for multiple applications, including low-power, low-phase noise, and high stability oscillators for clocking and timing. The performance of MEMS resonators is usually sensitive to the change of environment such as stress, temperature, acceleration etc. In these designs, challenging aspects include connecting the MEMS resonators to the circuit, and packaging. Multiple approaches have been used, such as: wirebonding, flip-chip MEMS, CMOS-MEMS, etc.

An acoustic wave resonator (AR) or a thin-film bulk acoustic wave (BAW) resonator is an example MEMS device that includes a piezoelectric material, which is sandwiched between two electrodes and acoustically isolated from the surrounding medium. When MEMS resonators use piezoelectric films with thicknesses ranging from several micrometers down to tenth of micrometers, they resonate in a frequency range of roughly 100 MHz to 10 GHz. Aluminum nitride (AlN) and zinc oxide (ZnO) are two common piezoelectric materials used to operate at this frequency range.

Several types of MEMS resonator based oscillators are known, such as: (a) Paidimarri, Arun, Nathan Ickes, and Anantha P. Chandrakasan, "A 0.68V 0.68 mW 2.4 GHz PLL for Ultra-Low Power RF Systems," 2015 IEEE Radio Frequency Integrated Circuits Symposium (RFIC) (May 2015); and (b) A. Nelson, J. Hu, J. Kaitila, R. Ruby and B. Otis, "A 22 µW, 2.0 GHz FBAR oscillator," 2011 *IEEE Radio Frequency Integrated Circuits Symposium*, Baltimore, Md., 2011, pp. 1-4. A high-Q MEMS-based oscillator may have moderate power consumption, low phase noise, and high accuracy/stability.

SUMMARY

In described examples, a micromechanical system (MEMS) is formed on a rigid thin platform substrate that is cantilevered from a base substrate. The platform substrate is connected to the base substrate by only a single point of contact, so that mechanical and thermal stress in the base substrate is prevented from affecting the platform substrate and MEMS structure built on the isolated platform.

DETAILED DESCRIPTION OF EXAMPLE EMBODIMENTS

Figure 1:
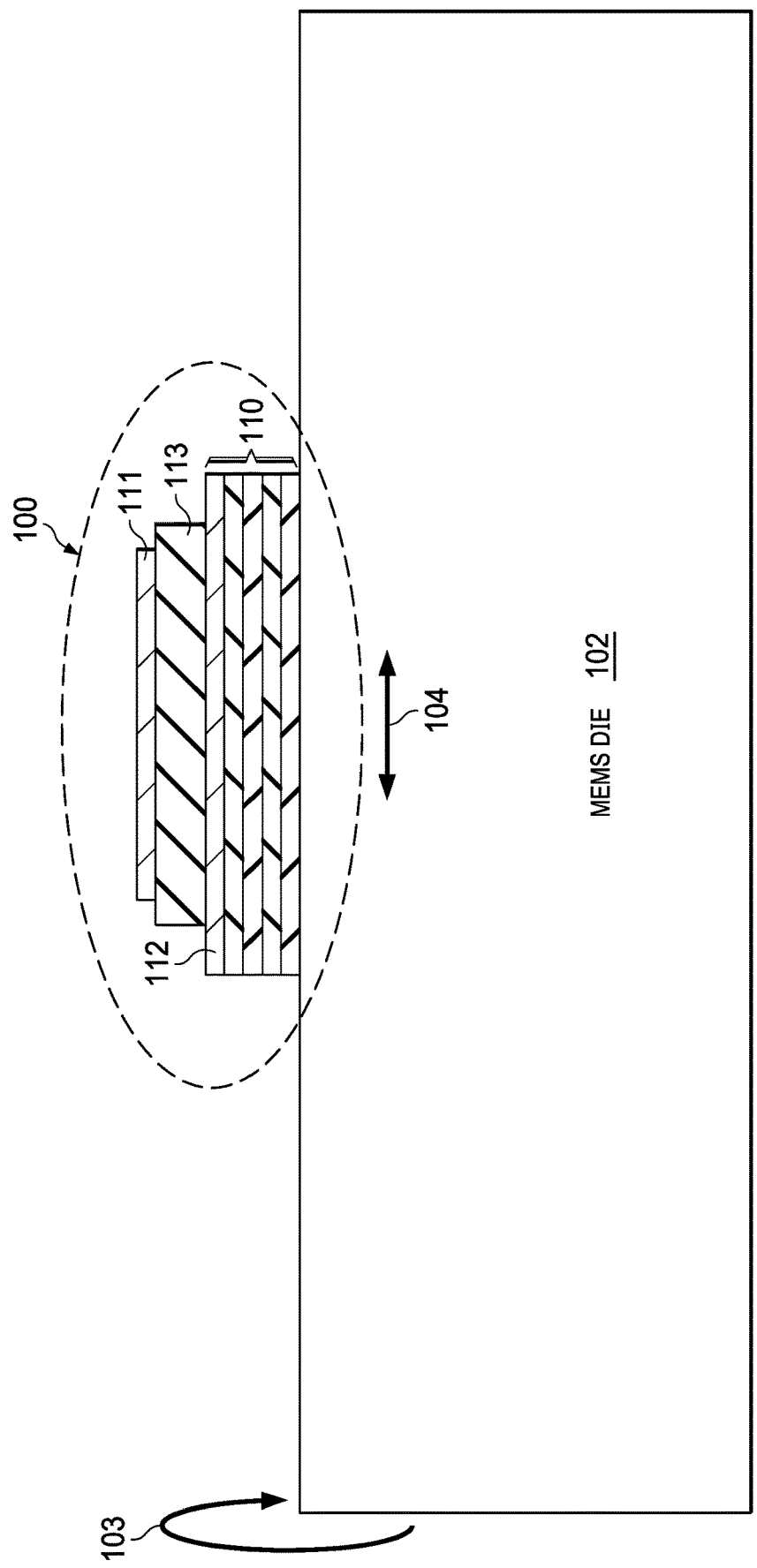
FIG. 1 is a cross-sectional view of a solidly mounted BAW resonator under the influence of mechanical stress.

In the drawings, like elements are denoted by like reference numerals for consistency.

Microelectronic devices that include frequency selective and frequency reference components are important for many electronic products requiring stable frequency signals or ability to discriminate between signals based on frequency diversity. For resonant MEMS (microelectromechanical systems) devices, stability is important for good performance.

FIG. 1 is a cross-sectional view of BAW resonator 100 that may be influenced by mechanical stress, as indicated at 103 and 104, which may act on substrate 102 and thereby affect the operation of MEMS resonator 100. Mechanical forces 103 and/or 104 may be the result of thermal expansion, vibration, bending, etc. In this example, MEMS resonator 100 is a solidly mounted resonator (SMR) that uses an acoustic reflector 110 at the bottom to prevent acoustic energy from leaking into substrate 102. MEMS resonator 100 includes an upper electrode 111 and a lower electrode 112 that are separated by a piezoelectric material 113. MEMS resonator 100 is directly mounted on substrate 102. Therefore, the resonant frequency of MEMS resonator 100 may drift due to mechanical stress from packaging, assembly, thermal gradients, etc.

In another example, a MEMS resonator or a quartz crystal may be released from the substrate to allow free vibration and to reduce energy leakage to the substrates. However, they require multiple anchors for mechanical robustness, and those multiple anchors make them subject to thermal or mechanical stresses of the underlying substrate. Single anchor structures usually suffer from curling, due to thin film residual stress.

Figure 2:
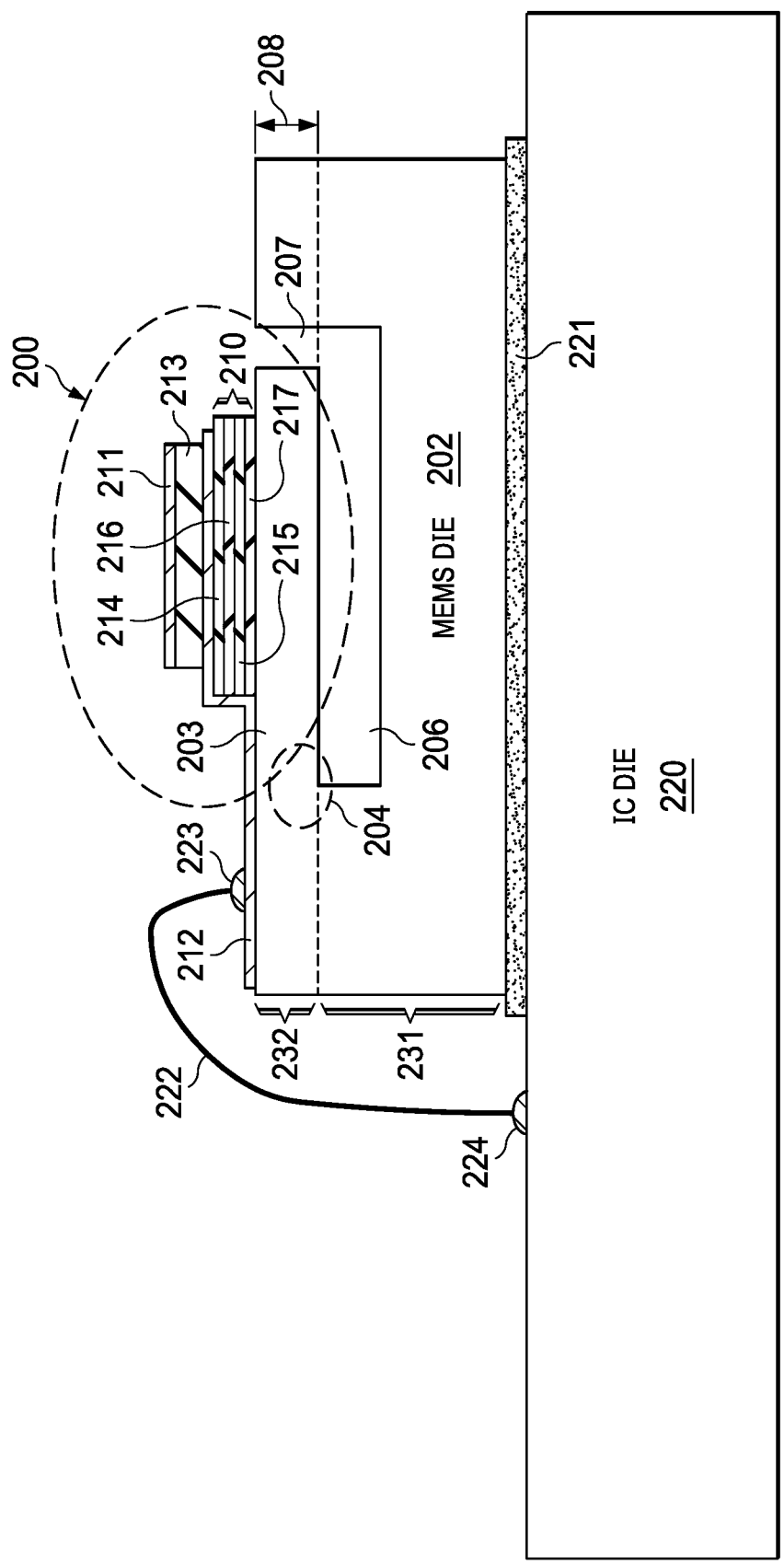
FIG. 2 is a cross-sectional view of a solidly mounted BAW resonator that is fabricated on a stress relieved platform substrate.
Figure 3:
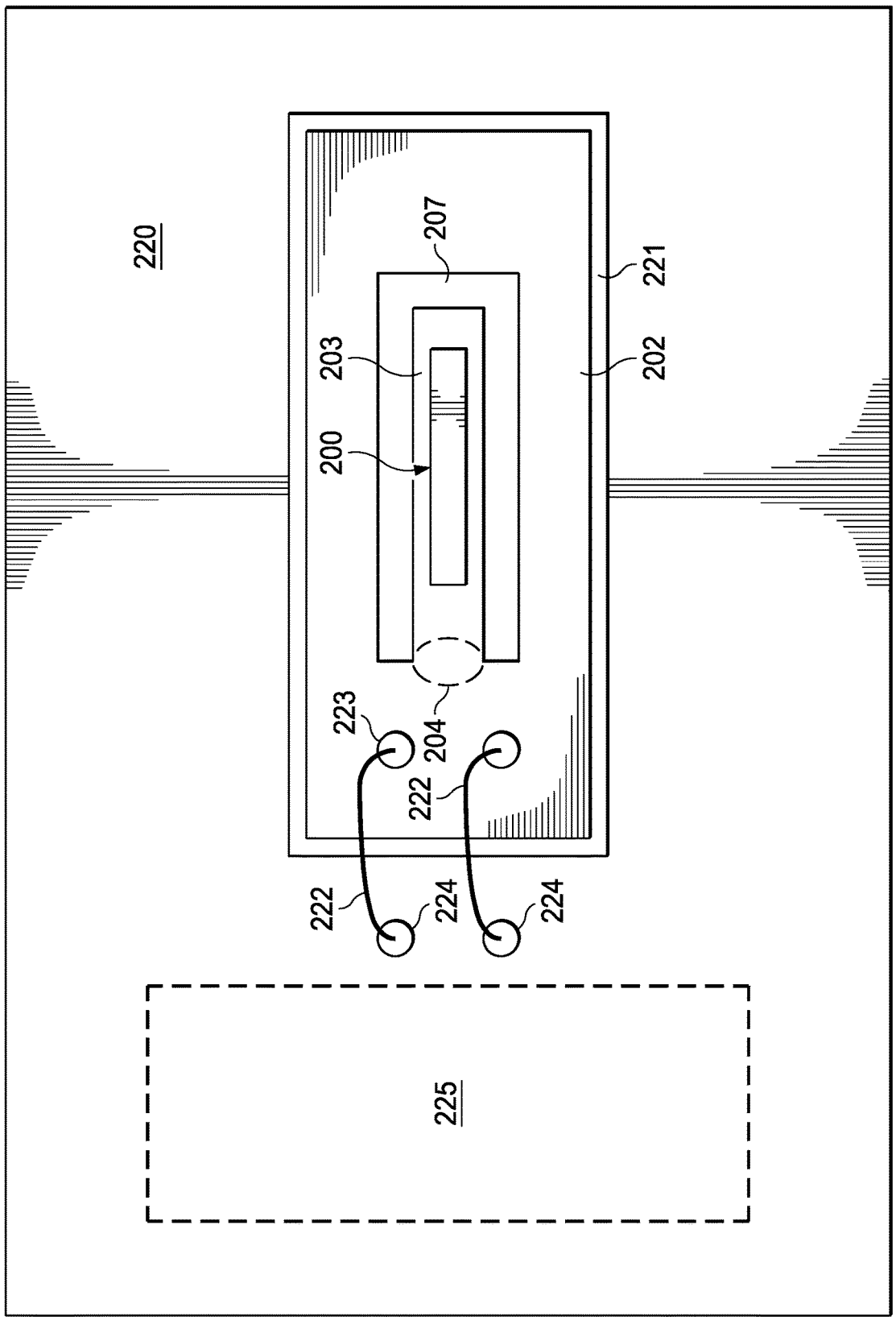
FIG. 3 is a top view of the solidly mounted BAW resonator of FIG. 2.

FIG. 2 is a cross-sectional view, and FIG. 3 is a top view, of a solidly mounted BAW resonator 200 that is fabricated on a stress relieved platform 203 that is anchored to substrate 202 by only a single anchor point 204. An open or released area 206 and a trench or channel 207 separate cantilevered platform 203 from a remainder of substrate 202. In this manner, rigid platform 203 is cantilevered and extends over the open area 206.

Open area 206 and trench 207 may be formed using known or later developed fabrication techniques. In one example, an initial substrate layer 231 may be etched to form a cavity for open area 206. This cavity may then be filled with a soluble or easily etched material, after which an additional substrate layer 232 may be formed over substrate layer 231. Channel 207 may then be etched through substrate layer 232, and the soluble or easily etched material may then be removed to form open area 206. In this manner, a cantilevered platform 203 is "released" from substrate 202 and is anchored at only a single (i.e., one) anchor point 204.

In this example, MEMS resonator 200 is a solidly mounted resonator (SMR) that uses an acoustic reflector 210 at the bottom to prevent acoustic energy from leaking into cantilevered platform 203 and the anchor 204. MEMS resonator 200 includes an upper electrode 211 and a lower electrode 212, which are separated by a piezoelectric material 213. MEMS resonator 200 may be fabricated directly on substrate 202.

Acoustic reflector 210 is also known as a dielectric mirror, Bragg mirror, etc. The example acoustic reflector 210 reduces acoustic energy leakage vertically through a bottom surface of the piezoelectric layer 213. In some examples, an additional acoustic reflector may be positioned on the sides and/or top of upper electrode 211. Any known or later developed Bragg mirror, dielectric mirror, acoustic reflector, etc. may be used to implement the acoustic reflector 210. The example acoustic reflector 210 may include alternating layers of materials with different acoustic impedances. In some examples, acoustic reflector 210 includes: (a) alternating flat conductive members (e.g., layers, sheets, plates, etc. of metal), two of which are designated by reference numerals 214 and 215; and (b) flat dielectric members (e.g., layers, sheets, plates, etc. of a dielectric material), two of which are designated by reference numerals 216 and 217. The thicknesses of and distances between the conductive members 214 and 215 are selected based on an intended resonance frequency of the BAW resonator 200. As a result, the acoustic reflector 210 reduces spurious modes, and it confines (such as by reflecting, directing, containing, etc.) acoustic energy of the main mode at that frequency in piezoelectric layer 213 and the two electrodes 211 and 212 which together act as a resonant cavity of the BAW resonator 200. In some examples, confining main mode acoustic energy refers to confining a portion of the main mode of acoustic energy. In this manner, the quality factor (Q) of the MEMS resonator 200 is increased and, in turn, the performance of a system including the example MEMS resonator 200 is improved. In some examples, the conductive members 214, 215 may be formed by tungsten (W), titanium tungsten (TiW) or copper (Cu). In some examples, the dielectric members 216, 217 may be formed by silicon dioxide (SiO2), or a carbon doped oxide dielectric (such as SiCOH), or aluminum nitride (AlN). In some examples, the acoustic reflector 210 may be implemented using a two-dimensional (2D) or a three-dimensional phononic crystal.

The example MEMS die 202 that includes MEMS resonator 200 may be attached to another substrate 220 using a die attach material 221. Substrate 220 may be an integrated circuit (IC) die 220 that includes various semiconductor devices interconnected to perform one or more functions.

The example electrodes 211 and 212 may be electrically coupled with other components in an IC package and/or external components. In some examples, bond wires 222 may be bonded between: bond pads 223 on MEMS die 202; and bond pads 224 on IC die 220. For example, the electrode 211 and/or the electrode 212 may be electrically coupled to circuitry 225 (on IC die 220 of FIG. 3), such as a digital logic circuit, an analog circuit, a processor core, a digital signal processor (DSP) core, etc. In some examples, circuitry 225 controls and/or uses a clock signal generated using the BAW resonator 200 to perform one or more functions, such as down conversion, up conversion, modulation, demodulation, etc. In some examples, BAW resonator 200 may be coupled with other acoustic resonators of different sizes and frequencies to form a filtering function.

IC die 220 may be attached to a lead frame or other substrate and then encapsulated, as described in more detail hereinbelow. IC die 220 and/or one of the electrodes 211, 212 may be electrically coupled to external contacts (not shown), such as contacts that may be provided by the lead frame or another substrate on which IC die 220 is mounted with bond wires.

In this manner, cantilevered platform 203 provides a "stress-free" structure and is fully decoupled from the MEMS/BAW resonator design and performance. Because the platform geometry is irrelevant to the MEMS/BAW resonator, the platform's thickness 208 (FIG. 2) and geometry may be designed as needed to avoid curling issues after release. Depending on the material used for substrate MEMS 202 and cantilevered platform 203, thickness and geometry 208 may be increased or decreased as needed to eliminate, or at least reduce (e.g., minimize), curling of platform 203. Accordingly, thickness 208 may be sufficiently thick for platform 203 to remain rigid (e.g., substantially rigid) and straight (e.g., approximately straight) after being released from MEMS substrate 202, to thereby minimize stress in MEMS resonator 200.

Figure 4:
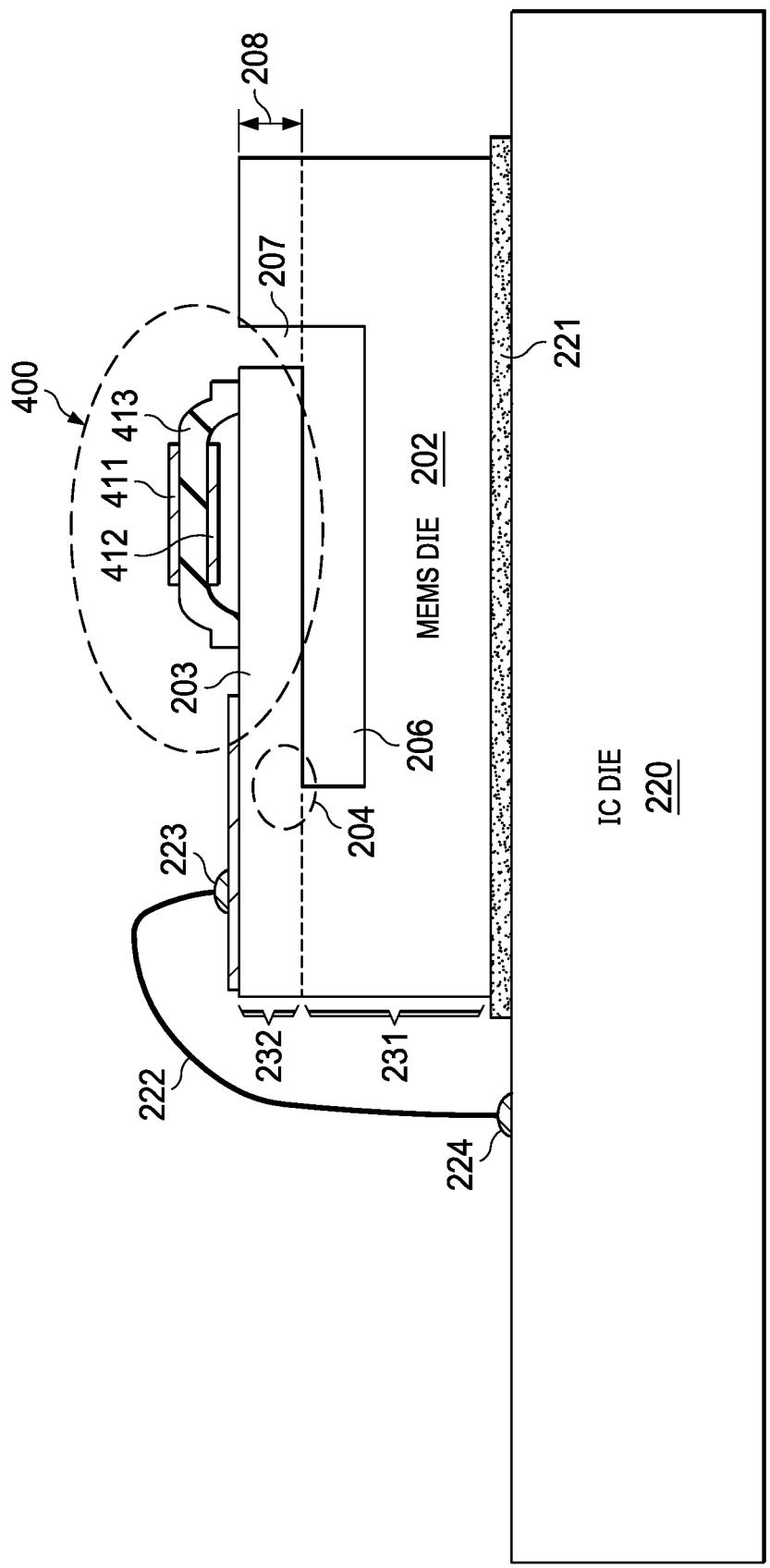
FIG. 4 is a cross-sectional view of a first example of a BAW/MEMS resonator that is fabricated on a stress relieved platform.

FIG. 4 is a cross-sectional view of another example of a MEMS resonator 400, which is fabricated on a stress relieved platform 2403 that is anchored to substrate 402 by only a single anchor point 204. An open area 206 and trench 207 separates cantilevered platform 203 from a remainder of substrate 202. In this manner, platform 203 is cantilevered and extends over open area 206.

Open area 206 and trench 207 may be formed using known or later developed fabrication techniques, such as described hereinabove for forming MEMS die 202 of FIGS. 2 and 3.

In this example, BAW resonator 400 is a thin film bulk acoustic resonator (FBAR), which is a fully released structure and requires cavities below and above the resonator to allow for vibration of piezoelectric member 413. Electrodes 411, 412 interact with piezoelectric member 413 to produce a resonant frequency signal across electrodes 411, 412.

The example electrodes 411 and 412 may be electrically coupled with other components in an IC package and/or external components. In some examples, bond wires 222 may be bonded between: bond pads 223 on MEMS die 202; and bond pads 224 on IC die 220. For example, the electrode 411 and/or the electrode 412 may be electrically coupled to circuitry (on IC die 220), such as a digital logic circuit, an analog circuit, a processor core, a digital signal processor (DSP) core, etc. In some examples, the circuitry controls and/or uses a clock signal generated using the MEMS resonator 400 to perform one or more functions, such as down conversion, up conversion, modulation, demodulation, etc. In some examples, MEMS resonator 400 is coupled with other acoustic resonators of different sizes to form a filtering function.

IC die 220 may be attached to a lead frame or other substrate and then encapsulated, as described in more detail hereinbelow. IC die 220 and/or one of the electrodes 411, 412 may be electrically coupled to external contacts (not shown), such as contacts that may be provided by the lead frame or another substrate on which IC die 220 is mounted with bond wires.

In this manner, cantilevered platform 203 provides a rigid stress-free structure and is fully decoupled from the MEMS/BAW resonator design. Because the platform geometry is irrelevant to the MEMS/BAW resonator, the platform's thickness and geometry 408 may be as designed as needed to avoid curling issues after release.

Figure 5:
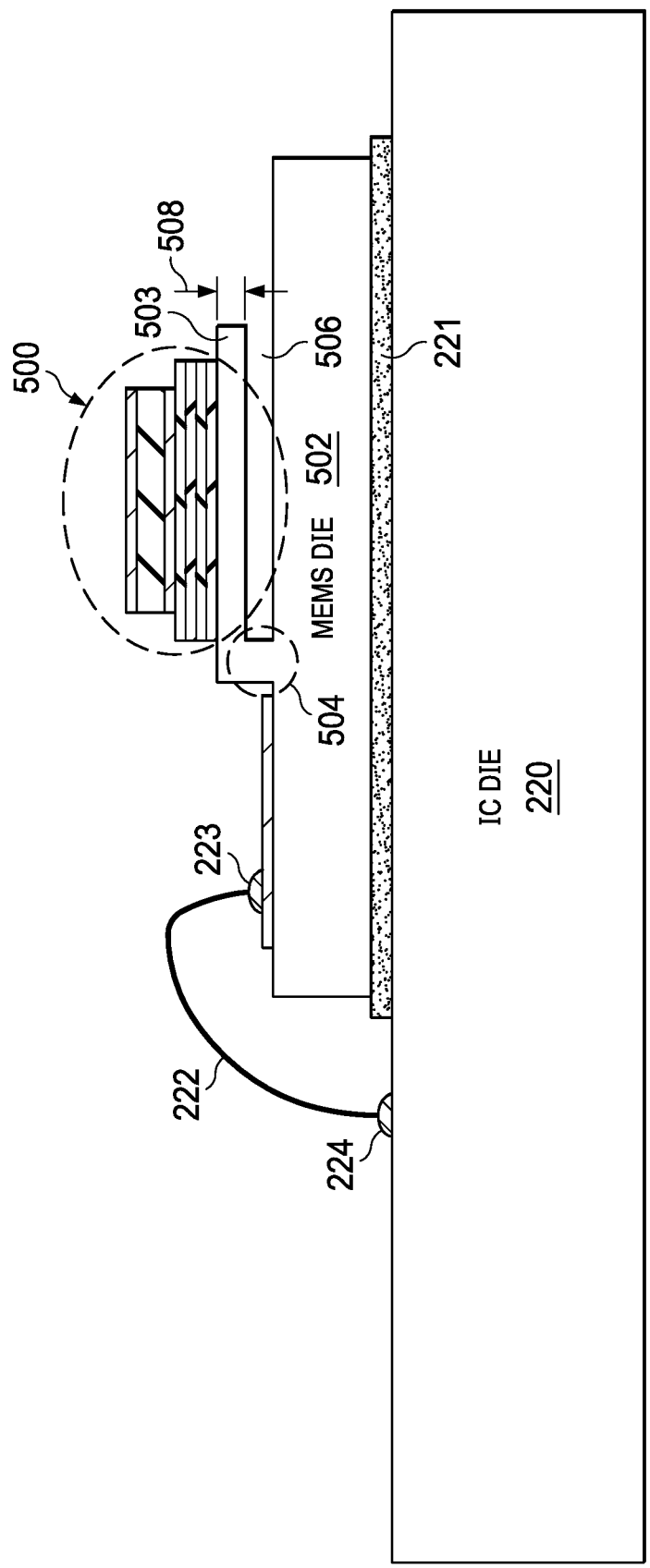
FIG. 5 is a cross-sectional view of a second example of a BAW/MEMS resonator that is fabricated on a stress relieved platform.

FIG. 5 is a cross-sectional view of another example of a MEMS resonator 500, which is fabricated on a stress released platform 503 that is anchored to substrate 502 by only a single anchor point 504. An open area 506 separates cantilevered platform 503 from a remainder of substrate 502. In this manner, platform 503 is cantilevered and extends over open area 506.

Open area 506 may be formed using known or later developed fabrication techniques. In one example, substrate 502 may be covered with a soluble or easily etched sacrificial layer that is then etched to form a cavity for anchor point 504. This cavity and the rest of the surface may then be filled with a layer of structural material that is then etched to define the geometry of cantilevered platform 503. The soluble or easily etched sacrificial material may then be removed to form open area 506. In this manner, cantilevered platform 503 is released from substrate 502 and is anchored only at anchor point 504.

In this example, MEMS resonator 500 may be similar to (or the same as) MEMS resonator 200. In another example, a MEMS resonator that is similar to (or the same as) MEMS resonator 400 may be used. Similarly, other configurations of MEMS resonators may be fabricated on cantilevered platform 503.

In this manner, cantilevered platform 503 provides a stress-free structure and is fully decoupled from the MEMS/BAW resonator design. Because the platform geometry is irrelevant to the MEMS/BAW resonator, the platform's thickness and geometry 508 may be as designed as needed to avoid curling issues after release.

Figure 6:
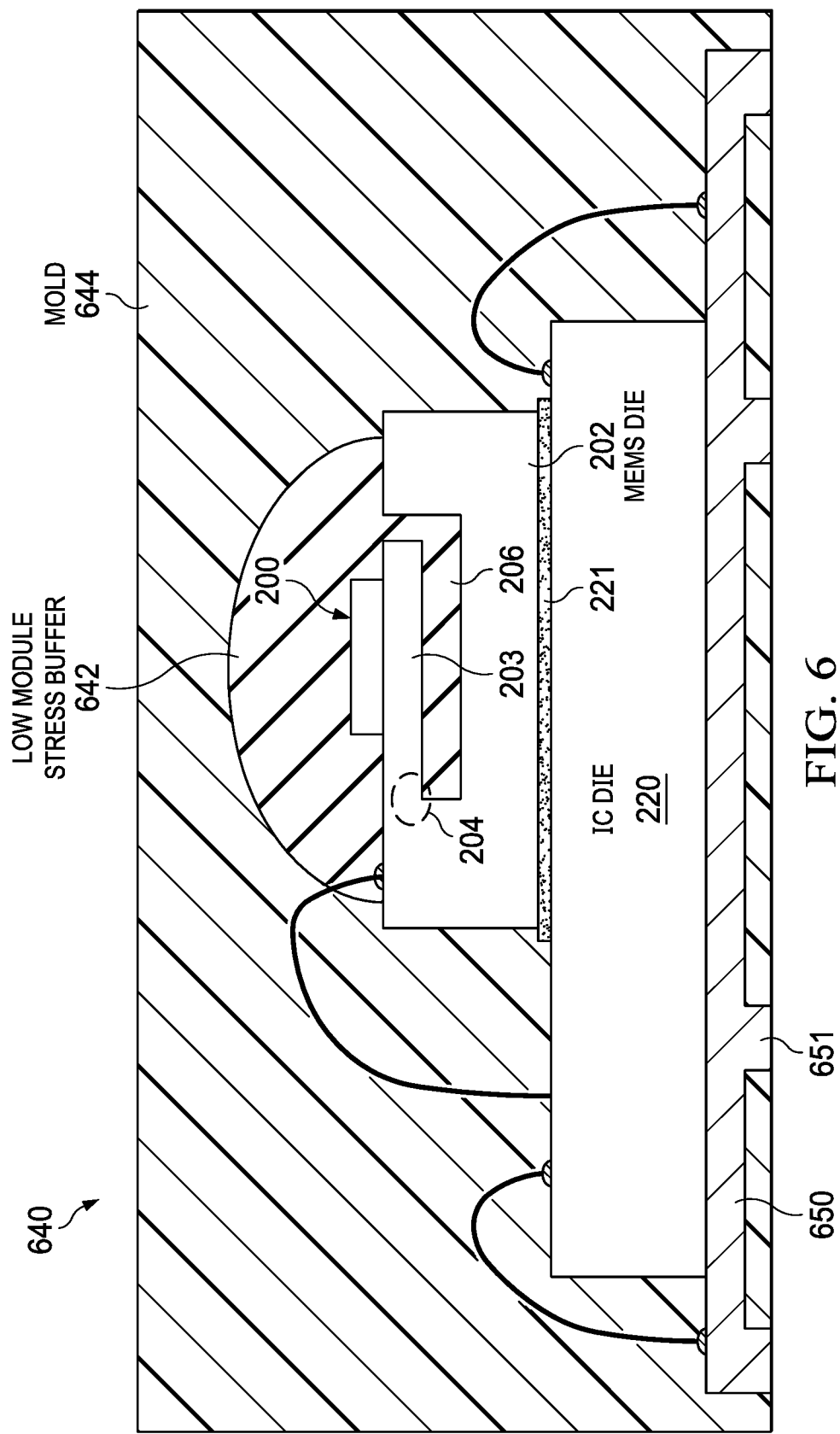
FIG. 6 is a cross-sectional view of a first example packaging technique.

FIG. 6 is a cross-sectional view of an example encapsulated integrated circuit 640, which incorporates an example packaging technique for the MEMS resonator 200 of FIG. 2. In this example, IC die 220 is mounted on a lead frame 650 that may include solder balls or contact pads 651 for connection to a system substrate such as a printed circuit board. In this example, IC 640 is a surface mount device with multiple contacts 651 on a bottom side of the package. However, in other examples, the IC package may have any number of known or later developed configurations, and may have various form(s), material(s), shape(s), dimension(s), number(s) of contacts, shape(s) of contacts, etc.

In this example, a material 642 that has a low modulus of elasticity may be placed over MEMS resonator 200, and into or around open area 206, to prevent high modulus mold compound 644 against touching BAW resonator 200 and against entering open area 206. IC die 220 and MEMS die 202 may then be encapsulated with mold compound 644, using a known or later developed encapsulation process.

In this manner, low modulus material 642 acts as a stress buffer and provides the cantilevered platform 203 a stress-free structure for BAW resonator 200 within an encapsulated package 640.

Figure 7:
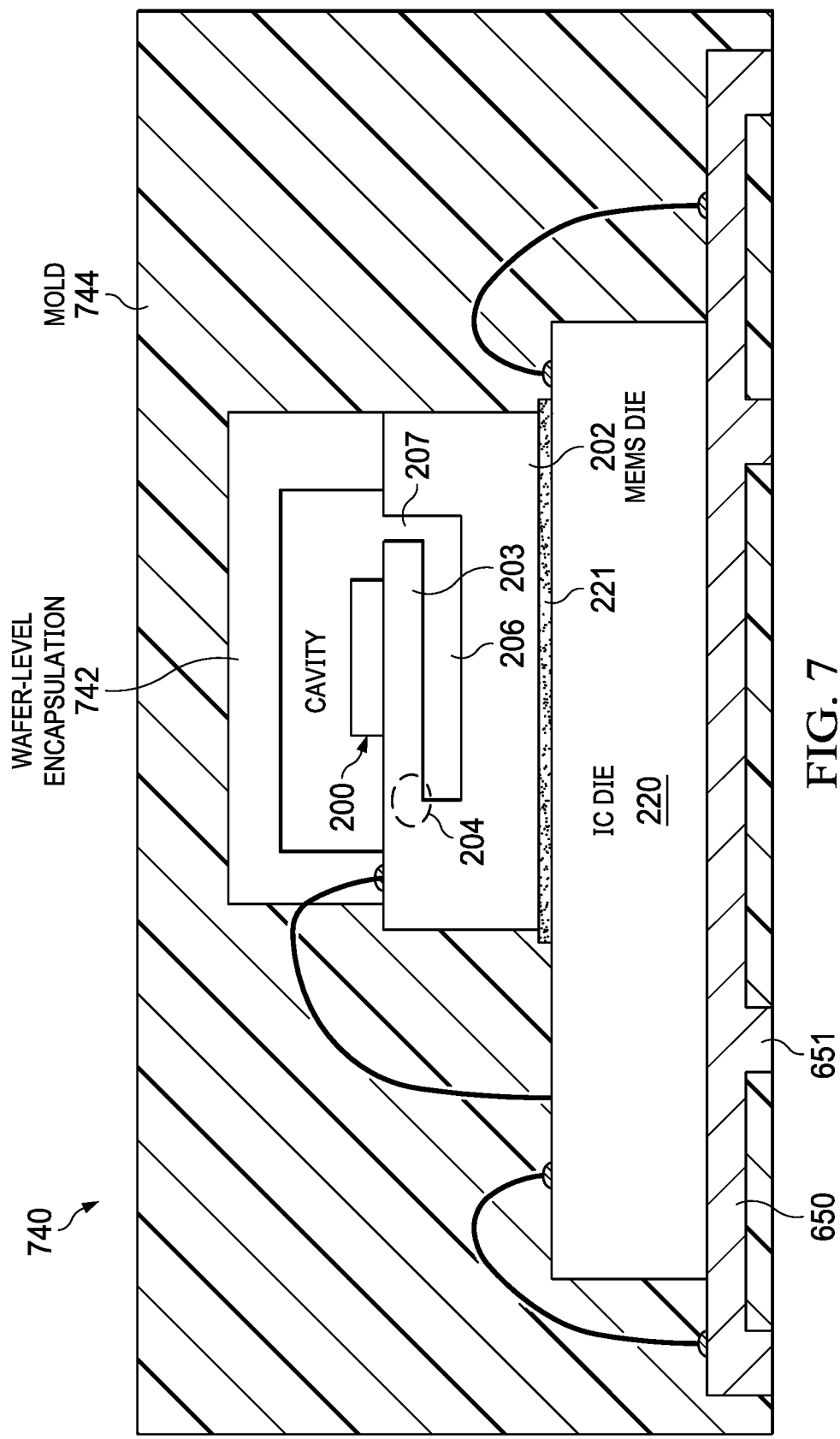
FIG. 7 is a cross-sectional view of a second example packaging technique.

FIG. 7 is a cross-sectional view of an example encapsulated integrated circuit 740, which incorporates another example packaging technique for the MEMS resonator 200 of FIG. 2. In this example, a protective "cavity wafer" or "hard hat" 742 may be placed over MEMS resonator 200, to prevent mold compound against touching MEMS resonator 200 and against entering open area 206. IC die 220 and MEMS die 202 may then be encapsulated with mold compound 744, using a known or later developed encapsulation process.

In this manner, hard hat 742 allows cantilevered platform 203 to provide a stress-free structure for MEMS resonator 200 within an encapsulated package 740.

FIGS. 6 and 7 show encapsulation of a MEMS resonator of FIGS. 2 and 3. Other examples of MEMS resonators, such as MEMS resonator 400 of FIG. 4 or MEMS resonator 500 of FIG. 5, may be encapsulated in a similar manner.

System Example

Figure 8:
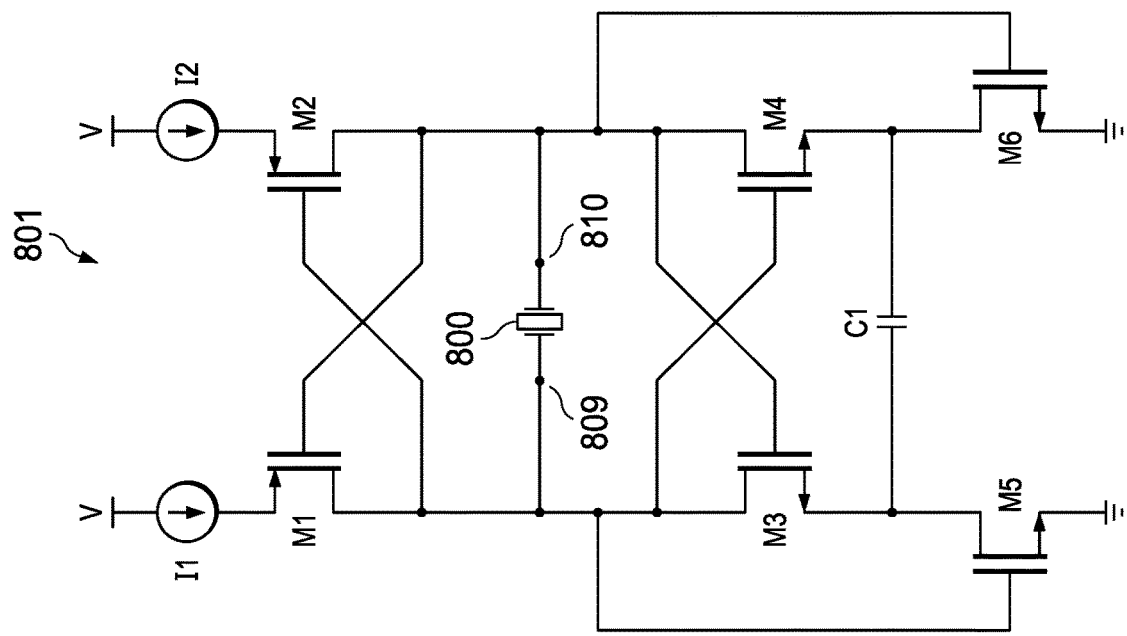
FIG. 8 is a schematic of an example oscillator that includes a BAW/MEMS resonator.

FIG. 8 is a schematic of an oscillator circuit 801 that uses a MEMS/BAW resonator 800, which may be similar to any of the MEMS/BAW resonators that are mounted on a cantilevered platform having only a single anchor point as described herein, such as MEMS resonator 200 on MEMS die 202 of FIG. 2, MEMS resonator 400 on MEMS die 402 of FIG. 4, and MEMS resonator 500 on MEMS die 502 of FIG. 5, etc. Oscillator circuit 801 may be implemented on a semiconductor substrate, such as using complimentary metal-oxide semiconductor (CMOS) transistors. In this example, current sources I1, I2 provide a constant current to cross-coupled differential pair PMOS transistors M1, M2 and cross-coupled differential pair NMOS transistors M3, M4. MEMS resonator 800 acts as a tank circuit. NMOS transistors M5, M6 and capacitor C1 may be needed to reduce gain at low frequencies. MEMS resonator 800 may function like a capacitor at low frequency, but will function like an open circuit at DC (direct current), and the circuit might actually latch without the aid of transistors M5, M6.

MEMSBAW resonator 800 may be implemented on a semiconductor substrate that is separate from the semiconductor substrate on which oscillator circuit 801 is fabricated. Usually, MEMS/BAW resonator 800 may be mounted on the CMOS oscillator chip or packaged in a side-by-side configuration. Bond wires may connect MEMS/BAW resonator terminals 809, 810 to bond pads on the CMOS oscillator chip.

FIG. 8 shows a system with an oscillator, but other systems may include two or more MEMS resonators as described herein to form other circuits, such as filter circuits, down conversion circuits, up conversion circuits, modulation circuits, demodulation circuits, etc.

Figure 9:
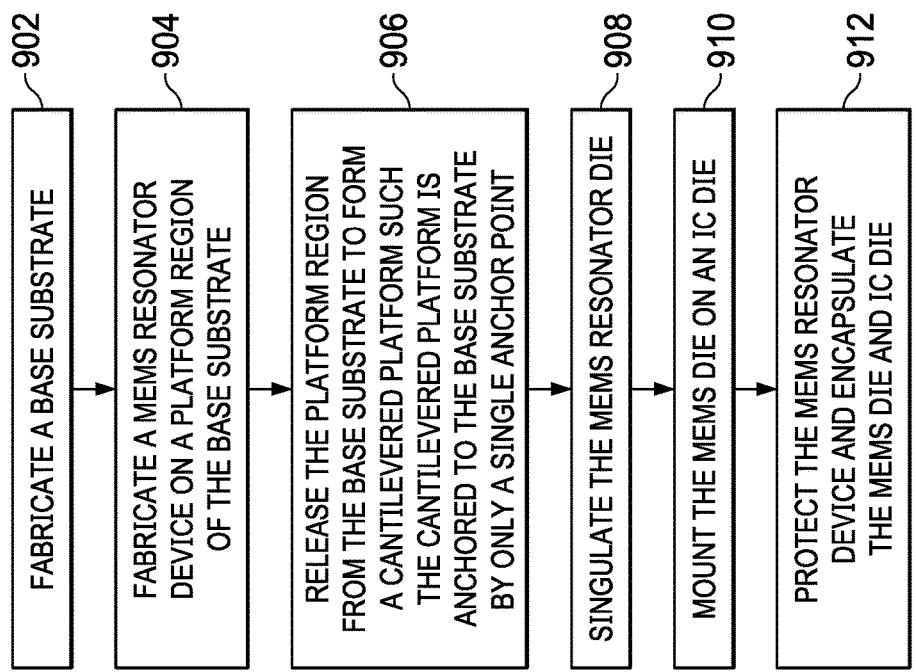
FIG. 9 is a flow diagram of fabrication of a BAW/MEMS resonator.

FIG. 9 is a flow diagram of fabrication of an example MEMS resonator. At 902, a base substrate is fabricated using known or later developed micromechanical system fabrication techniques. In some examples, the base substrate may be fabricated on a silicon wafer using known or later developed semiconductor fabrication techniques.

At 904, a MEMS resonator is fabricated on a platform region of the base substrate, such as region 203 of FIGS. 2 and 3. As described with regard to FIGS. 2-5, the MEMS resonator may be any of several types of known or later developed resonators, such as a solidly mounted bulk acoustic resonator, a thin film bulk acoustic resonator, a silicon or polysilicon based resonator, a crystal resonator, etc.

At 906, the platform region is then released from the base substrate to form a rigid cantilevered platform, such that the cantilevered platform is anchored to the base substrate by only a single anchor point. As described in more detail with regard to FIGS. 2-5, the cantilevered platform may be released by one or more steps of masking and etching, using known or later developed MEMS fabrication techniques.

At 908, the completed MEMS wafer may then be singulated to form individual MEMS resonator die. Singulation may be performed by various techniques, such as sawing, scribing, laser cutting, etc.

At 910, one or more MEMS resonator die may be mounted on an integrated circuit die and connected to circuitry on the IC die, as described in more detail with regard to FIGS. 2-5.

At 912, a protective material may be placed adjacent the MEMS resonator, to prevent encapsulation material against touching the active portion of the MEMS resonator while the MEMS die and IC die are being encapsulated. As described in more detail with regard to FIG. 6, the protective material may be an elastic material with a low modulus of elasticity.

In another example, the protective material may be a cavity die or other form of hard hat that may be positioned over the MEMS resonator, as described in more detail with regard to FIG. 7. In the case of using a cavity die, the encapsulation may be done at the wafer-level by bonding a wafer of MEMS resonator devices with a cavity wafer prior to singulation described at 908.

In this manner, a rigid cantilevered platform is fabricated to provide a stress-free structure that is fully decoupled from the MEMS/BAW resonator design. Because the platform geometry is irrelevant to the MEMS/BAW resonator, the platform's thickness and geometry may be as designed as needed to avoid curling issues after release.

Other Embodiments

In described examples, a single MEMS resonator is mounted, but two or more MEMS resonators may be mounted on one or more cantilevered platforms.

Various types of resonators may be mounted on a rigid cantilevered platform as described herein, such as is a thin film bulk acoustic resonator (FBAR), a solidly mounted resonator (SMR), a plane acoustic wave (PAW) resonator, a silicon or polysilicon resonator, a crystal resonator, etc.

The example IC package 640 of FIG. 6 and the example IC package 740 of FIG. 7 are surface mount devices with multiple contacts on a bottom side of the package. However, in other examples, the IC package may have any number of known or later developed configurations, and may have various form(s), material(s), shape(s), dimension(s), number(s) of contacts, shape(s) of contacts, etc. Moreover, the MEMS resonator(s) and/or any other components may be packaged, mounted, etc. in the IC package in various configurations. Other examples of IC packages include a wafer-level package and a die-level package.

Many devices are encapsulated with an epoxy plastic that adequately protects the semiconductor devices and has mechanical strength to support the leads and handling of the package. Some integrated circuits have no-lead packages, such as quad-flat no-leads (QFN) and dual-flat no-leads (DFN) devices that physically and electrically couple integrated circuits to printed circuit boards. Flat no-lead devices, also known as micro leadframe (MLF) and small outline no-leads (SON) devices, are based on a surface-mount technology that connects integrated circuits to the surfaces of printed circuit boards without through-holes in the printed circuit boards. Perimeter lands on the package provide electrical coupling to the printed circuit board. Another example may include packages that are entirely encased in mold compound, such as a dual inline package (DIP).

In another example, the cantilevered platform may be fabricated using an additive manufacturing process. Additive manufacturing enables the deposition of patterned materials in a rapid and cost efficient manner. Additive manufacturing processes are used in a number of areas. The International Association for Testing Materials (ASTM) has promulgated ASTM F7292-12a "Standard Terminology for Additive Manufacturing Technologies" 2012, which is incorporated by reference herein. Seven families of additive manufacturing processes are recognized by the ASTM F2792 standard, including: vat photopolymerization, powder bed fusion, binder jetting, material jetting, sheet lamination, material extrusion, and directed energy deposition. Hybrid processes may combine one or more of those seven basic processes with other manufacturing processes for additional processing flexibility. Other process advances allow additive manufacturing of 3D structures that have feature resolution of less than 100 nm, such as direct laser lithography, multi-photon lithograph, two-photon polymerization, etc.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. An integrated circuit package, comprising:
   an integrated circuit (IC) die including semiconductor circuitry formed thereon;
   a micromechanical system (MEMS) die mounted on the IC die; the MEMS die including a first portion and a second portion, the second portion including a cantilevered platform attached to the first portion, the first portion and the second portion composed of a same material; and
   a MEMS resonator directly attached to the cantilevered platform, the cantilevered platform including a distal end interfacing with the first portion and a proximal end opposite the distal end, wherein the MEMS resonator is directly attached proximal to the distal end, and wherein the distal end interfacing with the first portion includes silicon.

2. The integrated circuit package of claim 1, wherein the resonator is one of a thin film bulk acoustic resonator (FBAR), a solidly mounted resonator (SMR), or a plane acoustic wave (PAW) resonator.

3. The integrated circuit package of claim 1, wherein the resonator is an acoustic resonator.

4. The integrated circuit package of claim 1, further comprising an encapsulation material positioned in contact with portions of the MEMS die and the IC die.

5. The integrated circuit package of claim 4, further comprising an elastic material positioned between the encapsulation material and the MEMS resonator.

6. A semiconductor package comprising:
   a first die including a first portion and a second portion, the second portion including a cantilevered platform attached to the first portion, the first portion and the second portion composed of a same material; and
   a resonator directly attached to the cantilevered platform, the cantilevered platform including a distal end interfacing with the first portion and a proximal end opposite the distal end, wherein the resonator is directly attached to the cantilevered platform proximal to the distal end.

7. The semiconductor package of claim 6, wherein the first portion and the second portion are composed of Silicon.

8. The semiconductor package of claim 6, wherein the resonator is one of a bulk acoustic wave (BAW) resonator, a thin film bulk acoustic resonator (FBAR), a solidly mounted resonator (SMR), and a plane acoustic wave (PAW) resonator.

9. The semiconductor package of claim 6 further comprising a cavity in between a part of the first portion and in between an edge of the cantilevered platform and an edge of the second portion.

10. The semiconductor package of claim 6, wherein a surface of the cantilevered platform is perpendicular to a surface of a side of the first die.

11. The semiconductor package of claim 6, wherein surfaces of the first portion and the second portion are coplanar.

12. The semiconductor package of claim 6 further comprising an encapsulation material positioned in contact with the first die.

13. The semiconductor package of claim 12 further comprising an elastic material positioned between the encapsulation material and the resonator.

14. The semiconductor package of claim 12 further comprising a cavity die positioned between the encapsulation material and the resonator.

15. The semiconductor package of claim 6 further comprising a second die attached to, and electrically connected to, the first die.

16. The semiconductor package of claim 15 further comprising a lead frame attached to the second die and electrically connected to the first die and the second die.

17. A semiconductor package, comprising:
an integrated circuit (IC) die;
a micromechanical system (MEMS) die mounted on the IC die, the MEMS die including a first portion and a second portion, the second portion including a distal end and a proximal end, the proximal end attached to the first portion, wherein the first portion and the second portion are composed of a same material; and
a resonator directly attached proximate to the distal end than the proximal end.

18. The semiconductor package of claim 17, wherein the second portion includes a cantilevered platform.

19. The semiconductor package of claim 18, wherein the distal end forms a substantial part of the cantilevered platform.

20. The semiconductor package of claim 17, wherein the resonator is one of a bulk acoustic wave (BAW) resonator, a thin film bulk acoustic resonator (FBAR), a solidly mounted resonator (SMR), and a plane acoustic wave (PAW) resonator.

21. The semiconductor package of claim 17 further comprising an encapsulation material positioned in contact with the IC die and the MEMS die.

22. The semiconductor package of claim 21 further comprising a stress buffer layer positioned between the encapsulation material and the resonator.

23. The semiconductor package of claim 21 further comprising a cavity die positioned between the encapsulation material and the resonator.

24. The semiconductor package of claim 17, wherein the first portion and the second portion are composed of Silicon.

* * * * *